(12) United States Patent
Suematsu et al.

(10) Patent No.: US 6,201,441 B1
(45) Date of Patent: Mar. 13, 2001

(54) SEMICONDUCTOR CIRCUIT

(75) Inventors: Noriharu Suematsu; Shigeru Sugiyama; Kensuke Nakajima; Yoshitada Iyama; Fumimasa Kitabayashi, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/423,518

(22) PCT Filed: May 14, 1998

(86) PCT No.: PCT/JP98/02137

§ 371 Date: Nov. 10, 1999

§ 102(e) Date: Nov. 10, 1999

(87) PCT Pub. No.: WO99/59243

PCT Pub. Date: Nov. 18, 1999

(51) Int. Cl.[7] .................................................. H03F 1/14
(52) U.S. Cl. ................................. 330/51; 330/136
(58) Field of Search ............................... 330/51, 86, 302, 330/306, 136; 333/17.3

(56) References Cited

U.S. PATENT DOCUMENTS

| | | | |
|---|---|---|---|
| 4,881,047 | * 11/1989 | Waller, Jr. ......................... | 330/282 |
| 5,142,240 | * 8/1992 | Isota et al. ........................ | 330/149 |
| 5,285,169 | 2/1994 | Theus . | |
| 5,311,143 | * 5/1994 | Soliday ............................. | 330/127 |
| 5,721,513 | 2/1998 | Yuasa . | |
| 5,909,643 | * 6/1999 | Aihara .............................. | 455/127 |
| 5,923,215 | * 7/1999 | Hans ................................. | 330/149 |
| 5,973,560 | * 10/1999 | Lee ................................... | 330/136 |

FOREIGN PATENT DOCUMENTS

| | | |
|---|---|---|
| 60-245304 | 12/1985 | (JP) . |
| 62-23629 | 1/1987 | (JP) . |
| 4238407 | 8/1992 | (JP) . |
| 5259765 | 10/1993 | (JP) . |
| 6152287 | 5/1994 | (JP) . |
| 7273598 | 10/1995 | (JP) . |
| 823295 | 2/1996 | (JP) . |

* cited by examiner

*Primary Examiner*—Robert Pascal
*Assistant Examiner*—Henry Choe

(57) ABSTRACT

An operational command signal is output to one of an amplifier or a variable damper depending on the signal level of a high frequency signal.

12 Claims, 11 Drawing Sheets

SEMICONDUCTOR CIRCUIT

This application is the national phase under 35 U.S.C. §371 of PCT International Application No. PCT/JP98/02137 which has an International filing date of May 14, 1998 which designated the United States of America.

FIELD OF THE INVENTION

The present invention relates to a semiconductor circuit which amplifies and damps a high frequency band signal such as UHF, a microwave or a millimeter wave.

BACKGROUND TO THE INVENTION

FIG. 1 shows a conventional semiconductor circuit as disclosed for example in JP-A-62-23629. In the figure, reference numeral 1 denotes an input terminal which inputs a high frequency signal, 2 is a bias control circuit which supplies a bias current to a variable damper 3 when a signal level of a high frequency signal is higher than a reference level, 3 is a variable damper which damps a high frequency signal when a bias current is received from the bias control circuit 2, 4 is an amplifier which amplifies a high frequency signal damped by the variable damper 3 and 5 is an output terminal which outputs a high frequency signal amplified by the amplifier 4.

The operation of the invention will be outlined below.

Firstly, when a semiconductor circuit is used for signal reception, reception characteristics can deteriorate as a result of the variable damper 3 damping high frequency signals when the signal level of the high frequency signal input from the input terminal 1 is low.

On the other hand, if however damping of the high frequency signal by the variable damper 3 is terminated, the amplifier 4 may be saturated as the signal level of the high frequency signal is high.

In the above conventional example, when a high frequency signal is input from the input terminal 1, the bias control circuit 2 compares the signal level of the high frequency signal with a reference level. When the signal level of the high frequency signal is lower than the reference level, supply of the bias current to the variable damper 3 is terminated and the attenuation of the variable damper 3 is set to 0 dB.

In this way, reception characteristics may be improved by amplifying the signal level of the high frequency signal since a high frequency signal is output to the amplifier 4 without being damped by the damper 3.

Furthermore the bias control circuit 2 supplies a bias current to the variable damper 3 when the signal level of the high frequency signal is higher than the reference level and the attenuation of the variable damper 3 is set to XdB.

In this way, saturation of the amplifier 4 may be avoided because a high frequency signal is output to the amplifier 4 after the signal level of the high frequency signal is damped by the variable damper 3 with an attenuation of XdB. However in this case, although the S/N ratio by which the variable damper 4 damps the high frequency signal deteriorates to some degree, a S/N ratio required for reception is maintained since the signal level is high enough to saturate the amplifier 4.

When the attenuation of the variable damper 3 is set to 0 dB, as stated above, the variable damper 3 does not damp high frequency signals and a high frequency signal is output to the amplifier 4. When a high frequency signal is output to the variable amplifier 3, reception characteristics deteriorate and the amplifier 4 increases reception noise due to a certain degree of insertion loss.

In such a case, as shown in FIG. 2, it is possible to eliminate deterioration of reception characteristics by disposing the variable damper 3 on the output side of the amplifier 4. However such an arrangement will not allow saturation of the amplifier 4 to be avoided.

Since a conventional semiconductor circuit is constructed as above, when the variable damper 3 is disposed on the input side of the amplifier 4, it is possible to prevent saturation of the amplifier 4. However when the signal level of the high frequency signal is lower than a reference level, reception characteristics deteriorate due to insertion loss. When the variable damper 3 is disposed on the output side of the amplifier 4, it is possible to prevent deterioration of reception characteristics. However in this case, saturation of the amplifier 4 can not be avoided.

The present invention is proposed to solve the above problems and has the object of providing a semiconductor circuit which can prevent deterioration of reception characteristics and which can prevent saturation of an amplifier.

DISCLOSURE OF THE INVENTION

The semiconductor circuit of the present invention is adapted to generate an operation permission command to one of an amplifying means or a damping means in response to the signal level of an input signal.

In this way, when the signal level of the input signal is high, it is possible to prevent saturation of the amplifying means and when the signal level of the input signal is low, it is possible to prevent deterioration of reception characteristics by avoiding increases in reception noise.

When used for transmission, a power source of the amplifying means can be cut off when the output transmission is reduced. Thus it is possible to reduce power consumption.

The semiconductor circuit of the present invention is adapted to connect in direct series an amplifier which amplifies an input signal with a switch. The switch is placed in a short circuit state when receiving an operation permission command and is placed in an open state when not receiving an operation permission command.

In such a way, when the signal level of an input signal is higher than a reference level, it is possible to isolate the amplifier from the circuit.

The semiconductor circuit of the present invention is adapted to connect in series a damper which damps an input signal with a switch. The switch is placed in a short circuit state when receiving an operation permission command and is placed in an open state when not receiving an operation permission command.

In such a way, when the signal level of an input signal is lower than a reference level, it is possible to isolate the damper from the circuit.

The semiconductor circuit of the present invention is adapted to connect a switching semiconductor terminal to the output and input sides of the damper.

In such a way, when the signal level of an input signal is lower than a reference level, it is possible to isolate the damper from the circuit.

The semiconductor circuit of the present invention is adapted so that the switching semiconductor terminal makes a transition to an open state when a transistor which comprises the amplifying means makes the transition to a short circuit state. When the transistor makes the transition to an open state, the switching semiconductor terminal makes the transition to the short circuit state.

In such a way, when the signal level of an input signal is high, it is possible to prevent saturation of the transistor and when the when the signal level of an input signal is low, it is possible to prevent deterioration of the reception characteristics while avoiding increases in reception noise.

The semiconductor circuit of the present invention is adapted to connect a matching circuit between the damper and the input side of the switching semiconductor terminal and to connect a matching circuit between the damper and the output side of the switching semiconductor terminal.

In this way, it is possible to reduce input/output reflection loss when operating the damper.

The semiconductor circuit of the present invention comprises a damping means using a variable damper adapted to regulate attenuation.

In this way, it is possible to regulate a signal level of a high frequency signal output from the amplifier and as a result, it is possible to prevent saturation of the amplifier while maintaining reception characteristics of the receiver even when the dynamic range of the receiver connected to the output terminal is narrow.

The semiconductor circuit of the present invention comprises a damping means using a series circuit of a circuit terminal and a switching semiconductor terminal.

In this way, when the signal level of the input signal is lower than a reference level, damping of the high frequency signal is terminated. When the signal level of the input signal is higher than a reference level, damping of the high frequency signal is performed.

The semiconductor circuit of the present invention is adapted to control a switching semiconductor terminal while maintaining the operational state of the amplifier.

In this way, when the signal level of the input signal is higher than a reference level, it is possible to amplify a high frequency signal and when the signal level of the input signal is lower than a reference level, it is possible to prevent saturation by depressing the gain of the amplifier.

The semiconductor circuit of the present invention comprises a damping means which uses a T-type damper with a switching semiconductor terminal connected to the input side.

In this way, it is possible to eliminate the output-side switching semiconductor terminal and operate the T-type damper as a stable circuit on the output side.

The semiconductor circuit of the present invention comprises a damping means which uses a π-type damper with a switching semiconductor terminal connected to the input side.

In this way, it is possible to eliminate the output-side switching semiconductor terminal and operate the π-type damper as a stable circuit on the output side.

The semiconductor circuit of the present invention is adapted to connect a condenser between an earth and an earthing terminal of a π-type or a T-type damper and to apply a direct current voltage to the output terminal of the transistor which comprises the amplifier means from the earthing terminal.

In this way, it is possible to reduce the size of the circuit as an inductor for bias feed on the output side of the amplifier becomes unnecessary.

PREFERRED EMBODIMENTS OF THE INVENTION

In order to describe the invention in greater detail, the preferred embodiments will be outlined below with reference to the accompanying figures.

Embodiment 1

Figure 1:
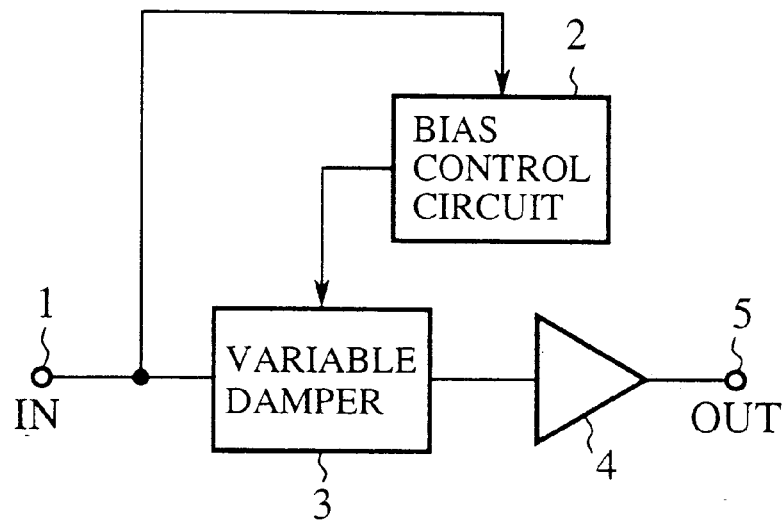
FIG. 1 shows a conventional semiconductor circuit.
Figure 2:
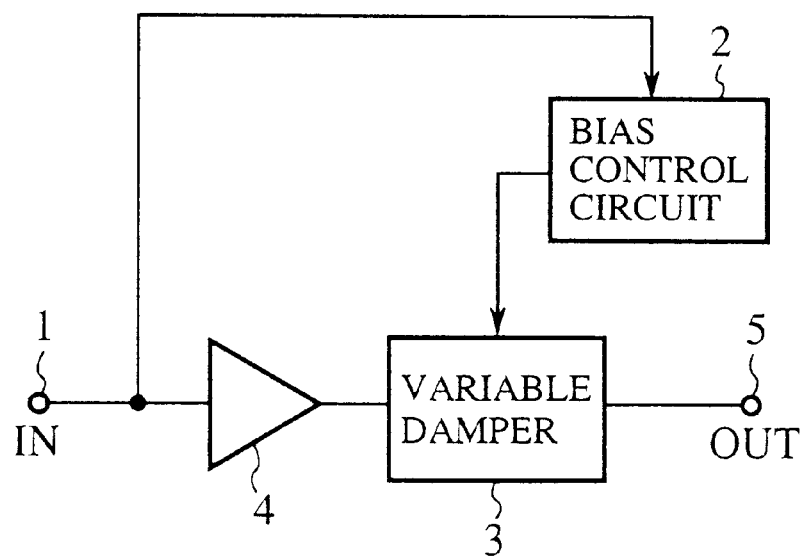
FIG. 2 shows a conventional semiconductor circuit.
Figure 3:
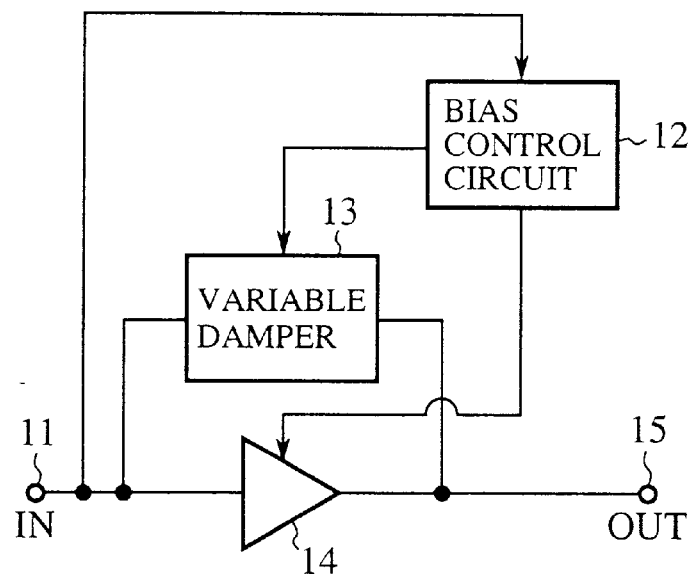
FIG. 3 shows a semiconductor circuit according to a first embodiment of the present invention.

FIG. 3 shows a semiconductor circuit according to a first embodiment of the present invention. In the figure, reference numeral 11 denotes an input terminal which inputs a high frequency signal (input signal), 12 (control means) is a bias control circuit which supplies a bias current (operation permission command) only to the variable damper 13 when the signal level of the high frequency signal is higher than a reference level and which supplies a bias current (operation permission command) only to the amplifier 14 when the signal level of the high frequency signal is lower than a reference level. 13 is a variable damper (damping means) which damps a high frequency signal when a bias current is supplied from the bias control circuit 12. 14 is an amplifier (amplifying means) which amplifies a high frequency signal when a bias current is supplied from the bias control circuit 12. 15 is an output terminal which outputs an amplified or damped high frequency signal.

The operation of the invention will be described below.

Firstly, when a semiconductor circuit is used for signal reception, reception characteristics can deteriorate as a result of the variable damper 13 damping a high frequency signal when the signal level of the high frequency signal input from the input terminal 1 is low.

On the other hand, when the signal level of the high frequency signal is high, the amplifier 4 may be saturated as the amplifier 14 amplifies the high frequency signal.

In the first embodiment, when a high frequency signal is input from the input terminal 11, the bias control circuit 12 compares the signal level of the high frequency signal with a reference level. When the signal level of the high frequency signal is lower than a reference level, a bias current is supplied to the amplifier 14 and the supply of a bias current to the variable damper 13 is terminated.

While the variable damper 13 receives a bias current, the damper operates on an attenuation of XdB. However when the supply of the bias current is terminated, the variable damper 13 is isolated from the circuit as an internal switch (not shown) is placed in the open position.

In this way, the circuit as shown in FIG. 3, allows signal level to be amplified and reception characteristics to be improved without damping the high frequency signal as the circuit is equivalent to a circuit comprising only the amplifier 14.

In this case, in contrast to the conventional example, it is possible to avoid insertion loss in the circuit accompanying the input of the high frequency signal since the variable damper 13 is isolated from the circuit.

On the other hand, the bias control circuit 12 supplies a bias current to the variable damper 13 when the signal level of the high frequency signal is higher than a reference level and terminates supply of the bias current to the amplifier 14.

While the amplifier 14 is receiving a bias current, the high frequency signal is amplified. However when the supply of the bias current is terminated, the amplifier is isolated from the circuit as an internal switch (not shown) is in the open condition.

In such a way, the circuit shown in FIG. 3 can prevent saturation of the amplifier 14 as the circuit is equivalent to a circuit comprising only the variable damper 13 alone is equivalent to the existing circuit.

However in this case, the S/N ratio is somewhat deteriorated as the variable damper 13 damps the high frequency signal. However a S/N ratio required for reception is maintained since the signal level is high enough to saturate the amplifier 14.

As is clear from the above, according to embodiment 1, the invention is adapted to supply a bias current to one of an amplifier 14 or a variable damper 13 depending on the signal level of a high frequency signal. Thus it is possible to prevent saturation of the amplifier 14 and to prevent deterioration of reception characteristics.

Embodiment 1 was described as using the semiconductor circuit for signal reception. However it is possible to use the circuit for signal transmission.

In this case, since loss in the output side of the amplifier 14 is low, reductions in output power are also low. Furthermore when output power is reduced, it is possible to reduce the direct current which is consumed during signal transmission.

Furthermore in embodiment 1, the number of stages of the amplifier has not been discussed. However the amplifier may be a one-stage amplifier or may have two stages or more. For example, the amplifier may be a plurality of amplifiers in series (a balance amplifier) connected in parallel.

In this context, it is noted that the impedance of the variable damper 13 on the permitted side need not always be open when loss increase of the one of the circuits in the input/output circuit of the amplifier 14 is permitted. However it is necessary for the impedance of the variable damper 13 on the loss allowed side to be open.

Embodiment 2

Figure 4:
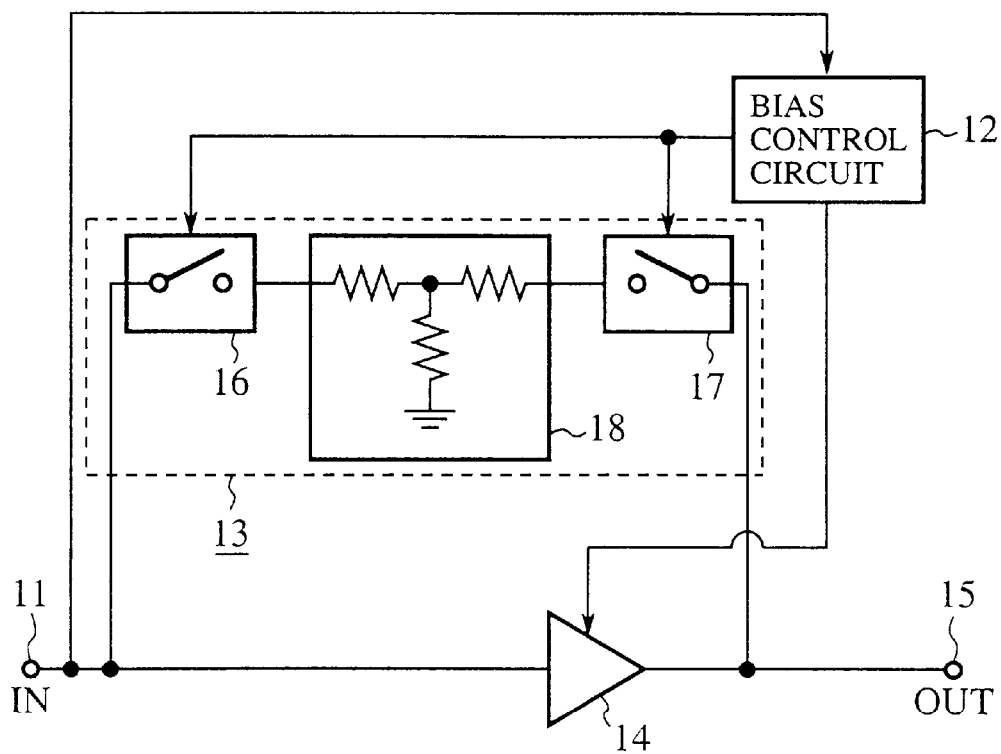
FIG. 4 shows a semiconductor circuit according to a second embodiment of the present invention.

FIG. 4 shows a semiconductor circuit according to a second embodiment of the present invention. In the figure, those components which are the same or similar to those of FIG. 3 are designated by the same reference numerals and will not be described further.

Reference numerals 16 and 17 denote a switch which is in a short circuit state when a bias current is applied from the bias control circuit 12 and is in an open state when a bias current is not supplied from the bias control circuit 12. 18 is a T-type damper which damps high frequency signals.

The operation of the invention will be described below.

The basic operation is the same as that described in embodiment 1. However in embodiment 2, the T-type damper 18 damps high frequency signals when a bias current is supplied from the bias control circuit 12 since the switches 16, 17 are in the short circuit state.

On the other hand, the T-type damper 18 is isolated from the circuit and damping of the high frequency signal is terminated when a bias current is not supplied from the bias control circuit 12 as the switches 16, 17 are in an open state.

The operation of the amplifier 14 is the same as that described in embodiment 1 and further description will be omitted.

Embodiment 3

Figure 5:
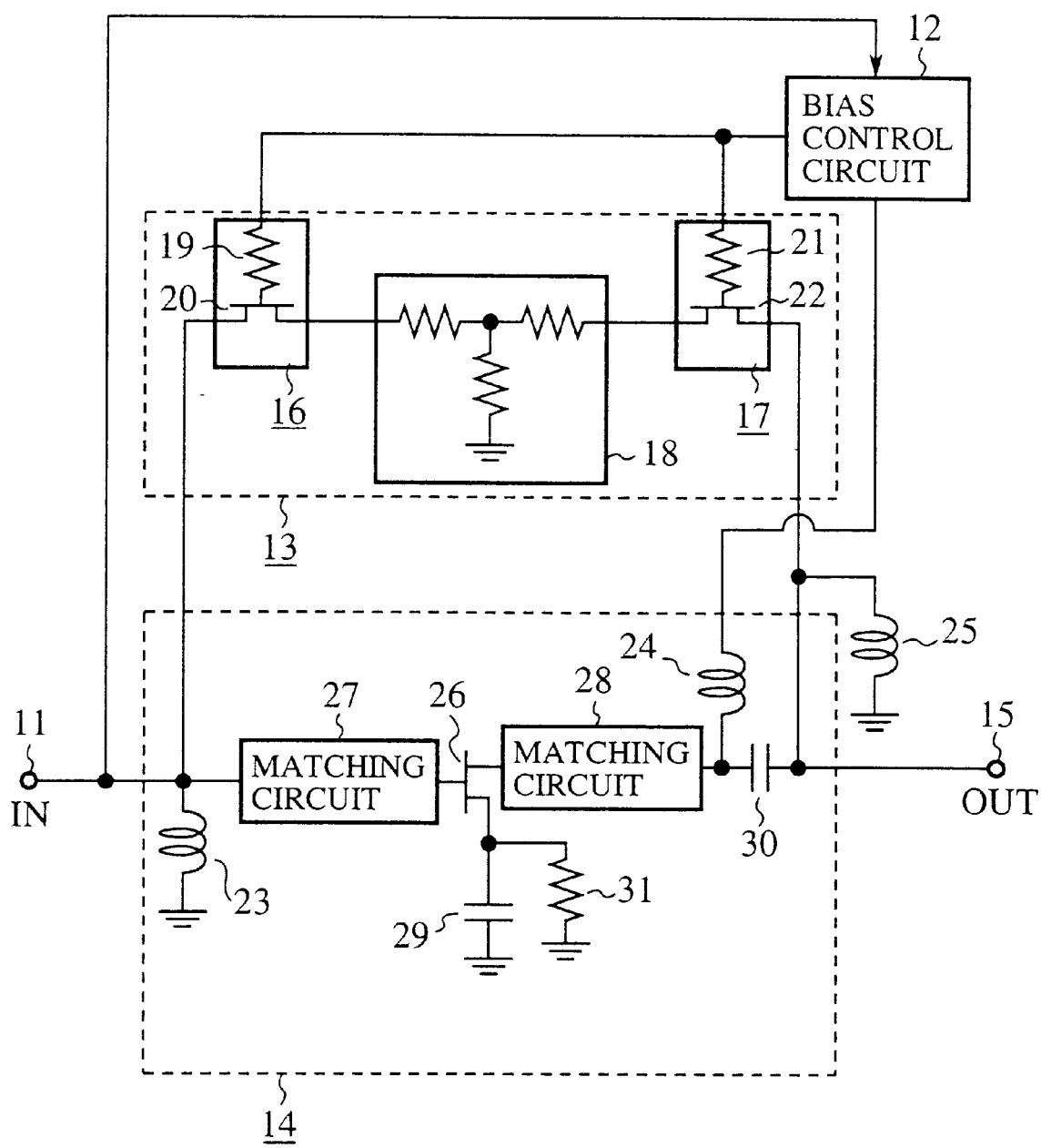
FIG. 5 shows a semiconductor circuit according to a third embodiment of the present invention.

FIG. 5 shows a semiconductor circuit according to a third embodiment of the present invention. In the figure, those components which are the same or similar to those of FIG. 4 are designated by the same reference numerals and will not be described further.

Reference numeral 19 denotes a bias resistor of a switch (switching semiconductor terminal) 16, 20 is a switching FET of a switch 16 which varies the state of the connection depending on variations in a gate voltage, 21 is a bias resistor of a switch (switching semiconductor terminal) 17, 22 is a switching FET of a switch 17 which varies the state of the connection depending on variations in a gate voltage, 23–25 denote feed bias inductors, 26 is an amplifier FET (transistor), 27 is a matching circuit which combines the impedance of the amplifier 14 with an input impedance, 28 is a matching circuit which combines the impedance of the amplifier 14 with the output impedance, 29, 30 are condensers for cutting DC current and 31 is a self-biasing resistor.

The operation of the invention will be described below.

Firstly, the gate voltage of the amplifier FET 26 is set to 0V by the bias feed inductor 23. The source voltage of the amplifier FET 26 is set to a positive voltage by the current which flows in the self-biasing resistor 31.

Therefore when a positive voltage is applied to the drain terminal of the amplifier FET 26 through the bias-feed inductor 24, the amplifier FET 26 initiates amplifier operation of the high amplitude signal.

On the other hand, when the drain voltage of the amplifier FET 26 is set to 0V, a current does not flow in the amplifier FET 26, the impedance of the amplifier FET 26 becomes limitlessly large and the amplifier FET 26 is equivalent to a state of being isolated from the circuit.

In this way, it is possible to achieve the same effect as embodiment 1 above. In the input/output circuit of the amplifier 14, when loss increase of one of the circuits is permitted, it is not necessary for the impedance of the variable damper 13 on the side on which loss is permitted to be always open. In this case, one of the switches 16, 17 may be omitted. However since the impedance of the variable damper 13 on the side on which loss is not permitted must always be open, the other switch can not be omitted.

Although a T-type damper 18 was used as a damper in the embodiment above, a damper with another structure (for example a π-type damper) may be used in order to achieve the same effect.

Although a series FET was used in switches 16, 17 in the above embodiment, other circuit layouts such as series-parallel layouts may be used. The same effect can also be achieved by use of a switching device other than a FET such as a pin diode.

Embodiment 4

Figure 6:
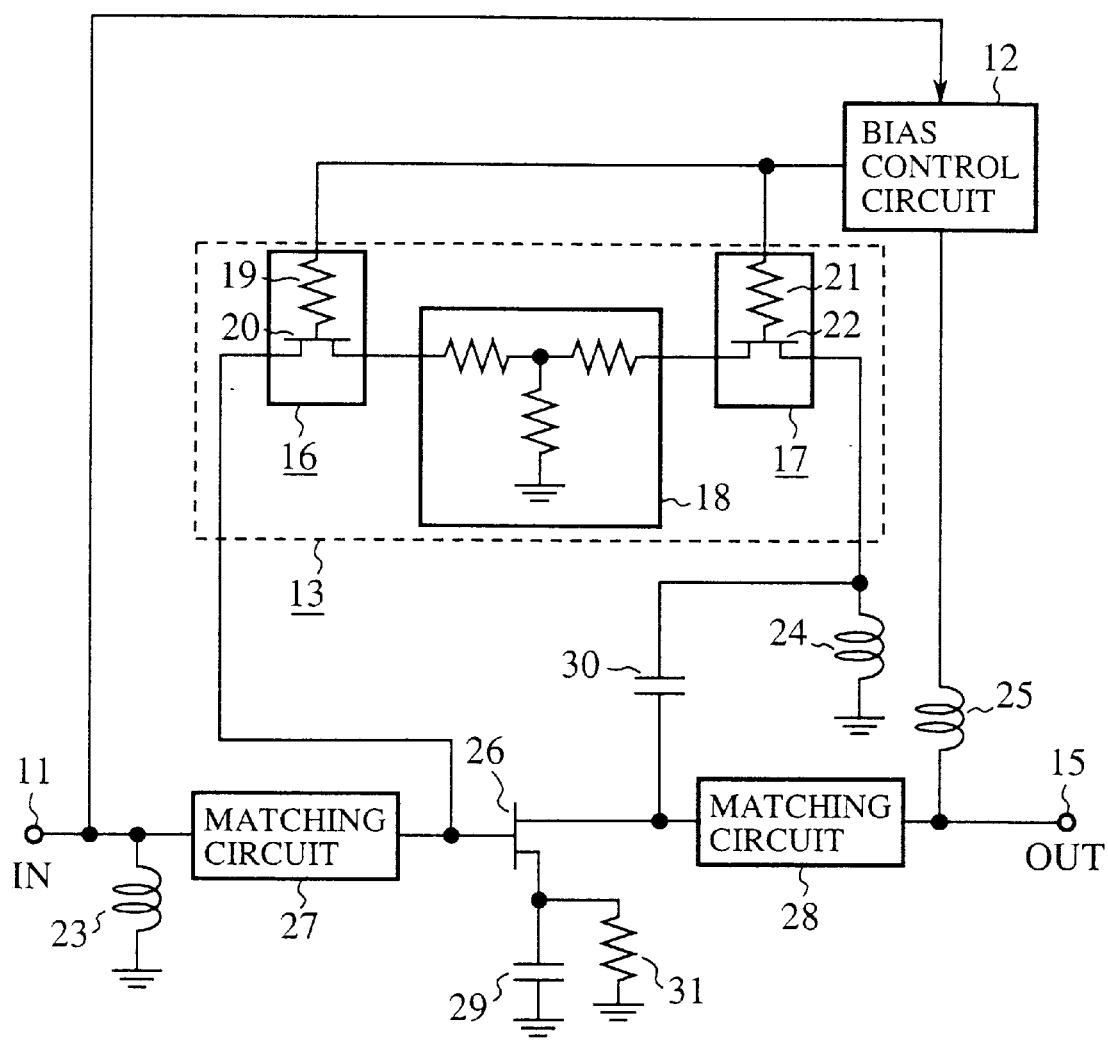
FIG. 6 shows a semiconductor circuit according to a fourth embodiment of the present invention.

In embodiment 3 above, a variable damper 13 was described as being connected with the input/output terminal of the amplifier 14. However as shown in FIG. 6, a variable damper 13 may be connected with the gate drain of the amplifier FET 26.

That is to say, when a variable damper 13 is connected with the input/output terminal of the amplifier 14, the circuit dimensions of the matching circuits 27, 28 of the amplifier 14 are difficult to apply to an integrated circuit since they are large in comparison with the variable damper 13 and the bias circuit of the amplifier FET 26. Furthermore when the frequency of the input signal is high, it is difficult to consider that the input/output impedance of the amplifier 14 is open when the amplifier is not in operation.

In contrast, when a variable damper 13 is connected with the gate drain of the amplifier FET 26, the circuit dimensions can easily be applied to an integrated circuit as it is possible to make the matching circuits 27, 28 circuits on the outside of the IC.

In comparison with the amplifier 14, a single amplifier FET 26 can reduce the influence on the variable damper 13 when not in use since the impedance when not in use is close to an open state.

However normally, the input/output impedance of the amplifier FET 26 during operation is high in comparison with the input/output impedance of the variable damper 13 or the amplifier 14. Thus the problem arises that the variable damper 13 can be easily affected when not in operation.

When increase loss is permitted in one of the circuits in the input/output circuit of the amplifier FET 26, it is not always necessary for the impedance of the variable damper 13 on the side on which loss is permitted to be open. In such a case, it is possible to omit one of the switches 16, 17. However since the impedance of the variable damper 13 on the side on which loss is not permitted must always be open, the other switch can not be omitted.

Figure 7:
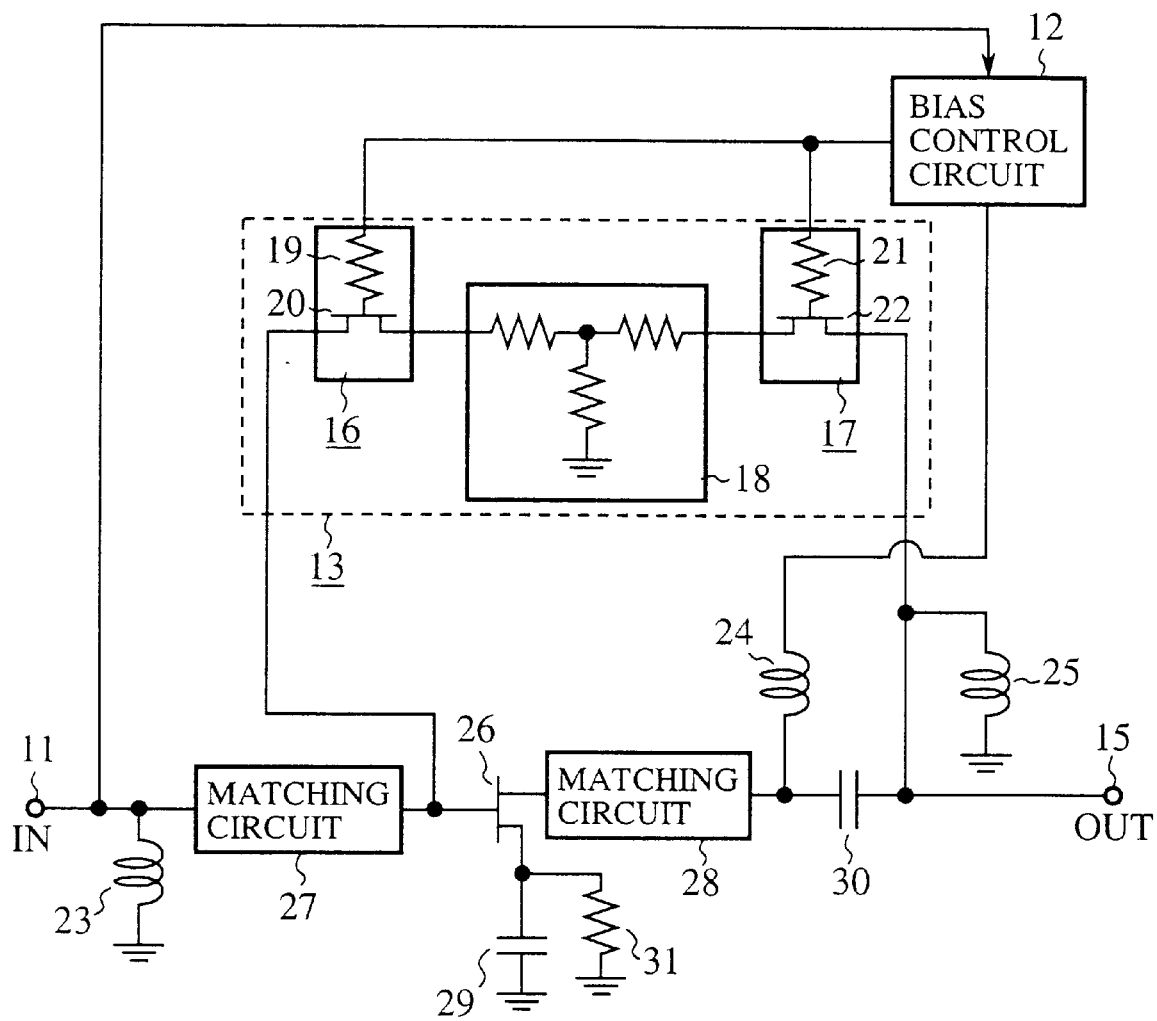
FIG. 7 shows a semiconductor circuit according to a fourth embodiment of the present invention.

As shown in FIG. 7, it is possible to achieve the same effect with respect to one of the circuits in the input/output circuit of the amplifier FET 26 by connecting the variable damper 13 to the outer side of the matching circuit.

Embodiment 5

Figure 8:
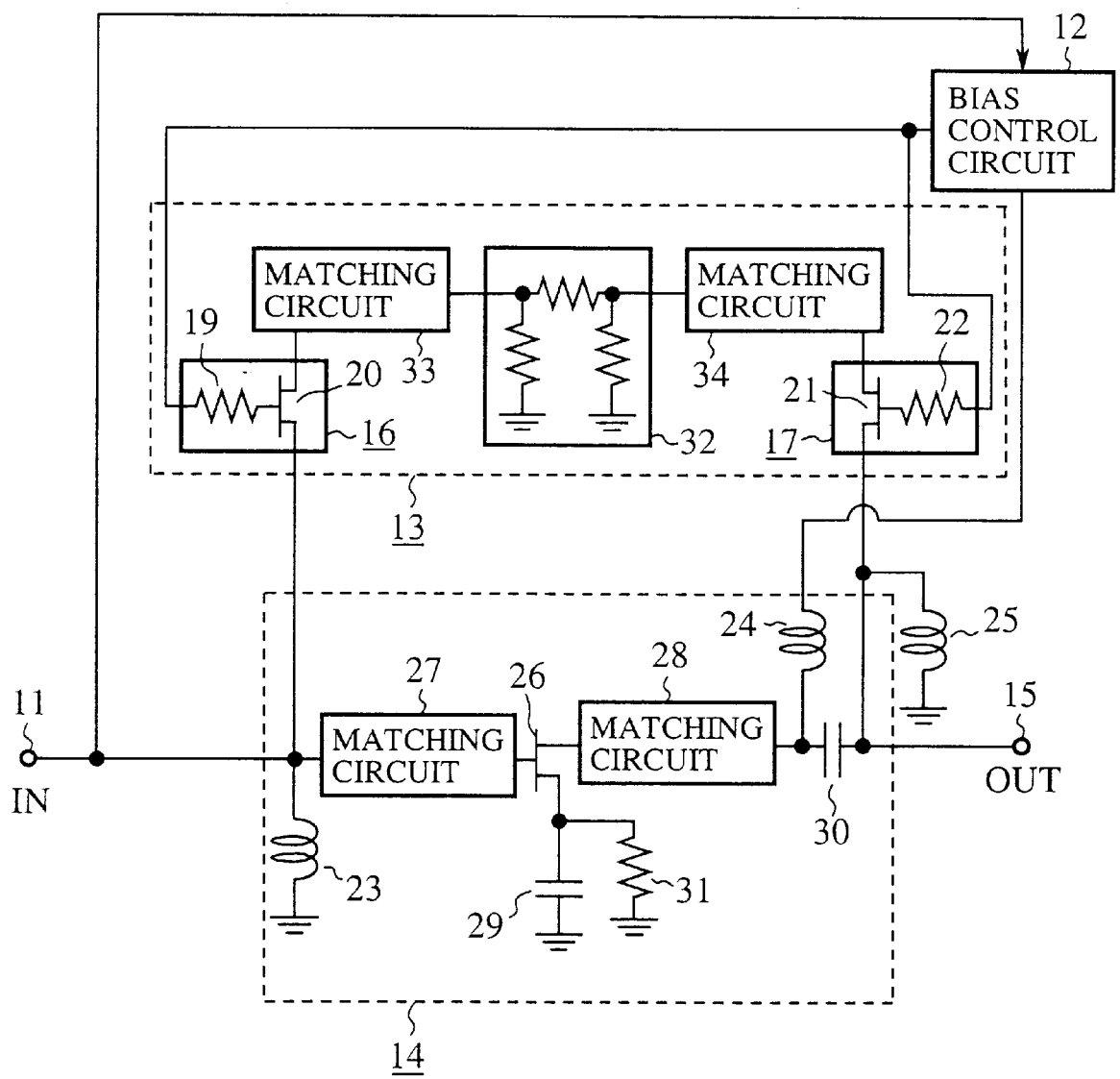
FIG. 8 shows a semiconductor circuit according to a fifth embodiment of the present invention.

FIG. 8 shows a semiconductor circuit according to a fifth embodiment of the present invention. In the figure, those components which are the same or similar to those of FIG. 5 are designated by the same reference numerals and will not be described further.

Reference numeral 32 denotes a π-type damper which damps a high frequency signal, 33 is a matching circuit which combines the impedance of the variable damper 13 with the input impedance, 34 is a matching circuit which combines the impedance of the variable damper 13 with the output impedance.

The operation of the invention will be described below.

The basic operation of the present embodiment is the same as that described above in embodiment 3. However in embodiment 5, the points of difference reside in the fact that a π-type damper 32 is connected instead of the T-type damper 18 and the matching circuits 33, 34 are connected.

The substitution of a π-type damper 32 instead of the T-type damper 18 has no effect on the characteristics or the operation. However when dealing with a high frequency, the input/output impedance of the amplifier 14 is sometimes can not be regarded as being in the open state when the amplifier 14 is in a non-operational state as the switches 16, 17 are in a short circuit state (the variable damper 13 is operating).

Thus in embodiment 5, in order to avoid any effect of the amplifier 14, the impedance of the variable damper 13 is combined with the output impedance and the input/output reflection when the variable damper 13 is in operation is reduced by connecting the matching circuits 33, 34.

When the variable damper 13 is not in operation as the switches 16, 17 are in an open state, there is no effect on the operation of the amplifier 14 as a result of the presence or absence of the matching circuits 33, 34.

Embodiment 6

Figure 9:
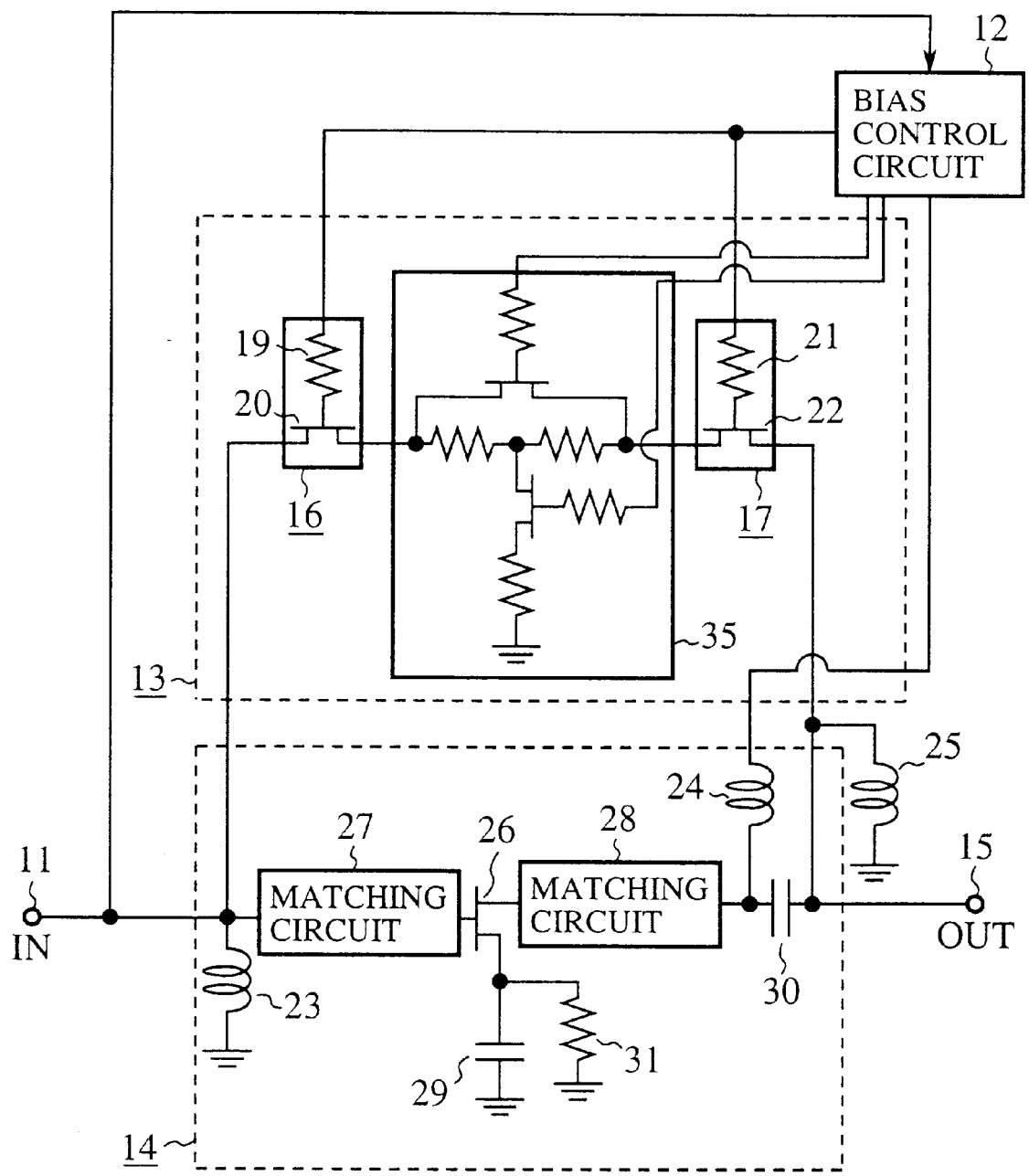
FIG. 9 shows a semiconductor circuit according to a sixth embodiment of the present invention.

FIG. 9 shows a semiconductor circuit according to a sixth embodiment of the present invention. In the figure, those components which are the same or similar to those of FIG. 5 are designated by the same reference numerals and will not be described further.

Reference numeral 35 denotes a bridged T-type variable damper with variable attenuation.

The operation of the present embodiment will be described below.

In embodiment 3, the T-type damper 18 with a fixed attenuation XdB was used. However embodiment 6 is different in that when the variable damper 13 is in operation, a bridged T-type variable damper 35 is used which can regulate the level of attenuation.

In this way, it is possible to regulate the signal level of the high frequency signal output from the output terminal 15. As a result, even when the dynamic range of the receiver connected to the output terminal 15 is narrow, reception characteristics of the receiver may be maintained and it is possible to prevent saturation of the amplifier 14.

Although a bridged T-type variable damper 35 is used as a variable damper 13 in the present embodiment, other types of variable dampers may be used to achieve the same effect.

When a variable damper is used in which the attenuation is limitlessly large and the input/output impedance is open, it is possible to omit the switches 16, 17 connected to the input/output of the variable damper. When the input/output impedance is in a short circuit state, it is also possible to omit the switches 16, 17. However a line with a 1/4 wavelength must be connected to consider that the impedance from the outside is open.

Embodiment 7

Figure 10:
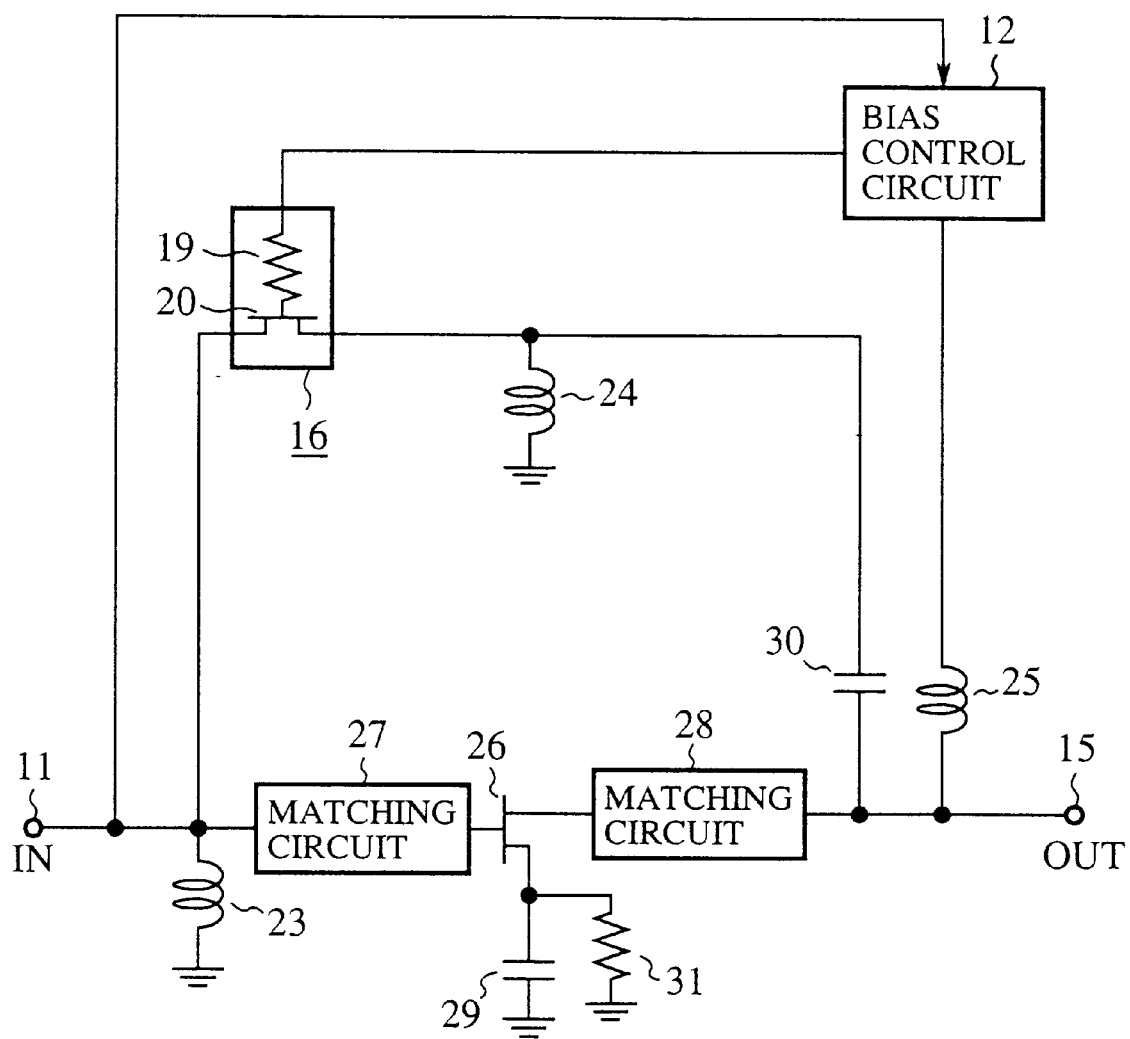
FIG. 10 shows a semiconductor circuit according to a seventh embodiment of the present invention.

In embodiment 3, the variable damper 13 was described using a switch 16 or a T-type damper 18. However as shown in FIG. 10, it is possible to make the variable damper 13 using only the switch 16.

That is to say, when the switch 16 is open, it is equivalent to a circuit comprised only of the amplifier 14 and when the switch 16 is short circuited, the amplifier 14 isolated from the circuit and the circuit is equivalent to a through circuit with a gain of 0 dB. In such a situation, it is possible to prevent saturation of the receiver connected in later stages.

When connected in series, the switch 16 is the only circuit terminal which is considered when a high frequency signal is input (the impedance of the DC cutting condenser has a value of approximately zero when the frequency is high). However other circuit terminals may also be connected. For example, when a resistor is connected in series to the switch 16, it is possible to regard it as a damper when the resistance is sufficiently low in comparison with the input/output impedance.

Embodiment 8

Figure 11:
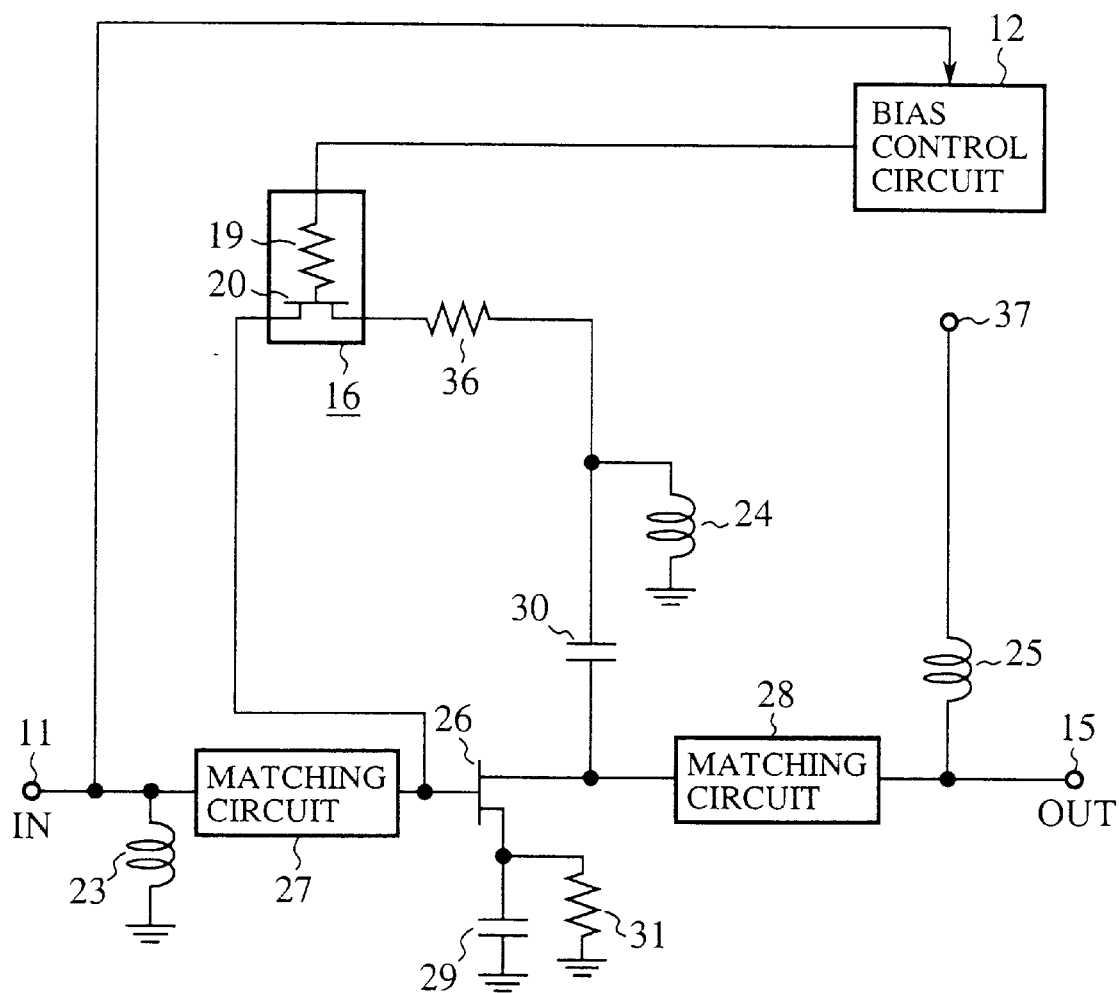
FIG. 11 shows a semiconductor circuit according to an eighth embodiment of the present invention.

FIG. 11 shows a semiconductor circuit according to an eighth embodiment of the present invention. In the figure, those components which are the same or similar to those of FIG. 10 are designated by the same reference numerals and will not be described further.

Reference numeral 36 denotes a feedback resistor of the amplifier FET 26, 37 is a power source terminal.

The operation of the invention will be described below.

The basic operation is the same as that of embodiment 7. However the points of difference are that a feedback resistor 36 is connected to the output side of the switch 16 and a power source terminal 37 is connected to the drain terminal of the amplifier FET 26.

That is to say, in embodiment 7, although the drain terminal of the amplifier FET 26 is supplied with power from the bias control circuit 12, in embodiment 8, normal power supply is from a power source (not shown) which is connected to the power source terminal 39 and the amplifier FET 26 is maintained during normal operation.

When the switch 16 is open, the switch 16 is treated as an open circuit from the point of view of the input circuit of the amplifier 14. Furthermore although the feedback resistor 36 with an open end may appear connected from the point of view of the output circuit of the amplifier 14, this is equivalent to a simple open circuit.

Thus in such a case, reception characteristics do not deteriorate as this circuit is equivalent to a circuit comprising only the amplifier 14.

When the switch 16 is short-circuited, the feedback resistor 36 is seen as connected with the gate drain of the amplifier FET 26.

Thus in such a case, since negative feedback is applied to the amplifier FET 26 by the feedback resistor 36 the gain of the amplifier 14 is reduced and saturation becomes unlikely.

Embodiment 9

Figure 12:
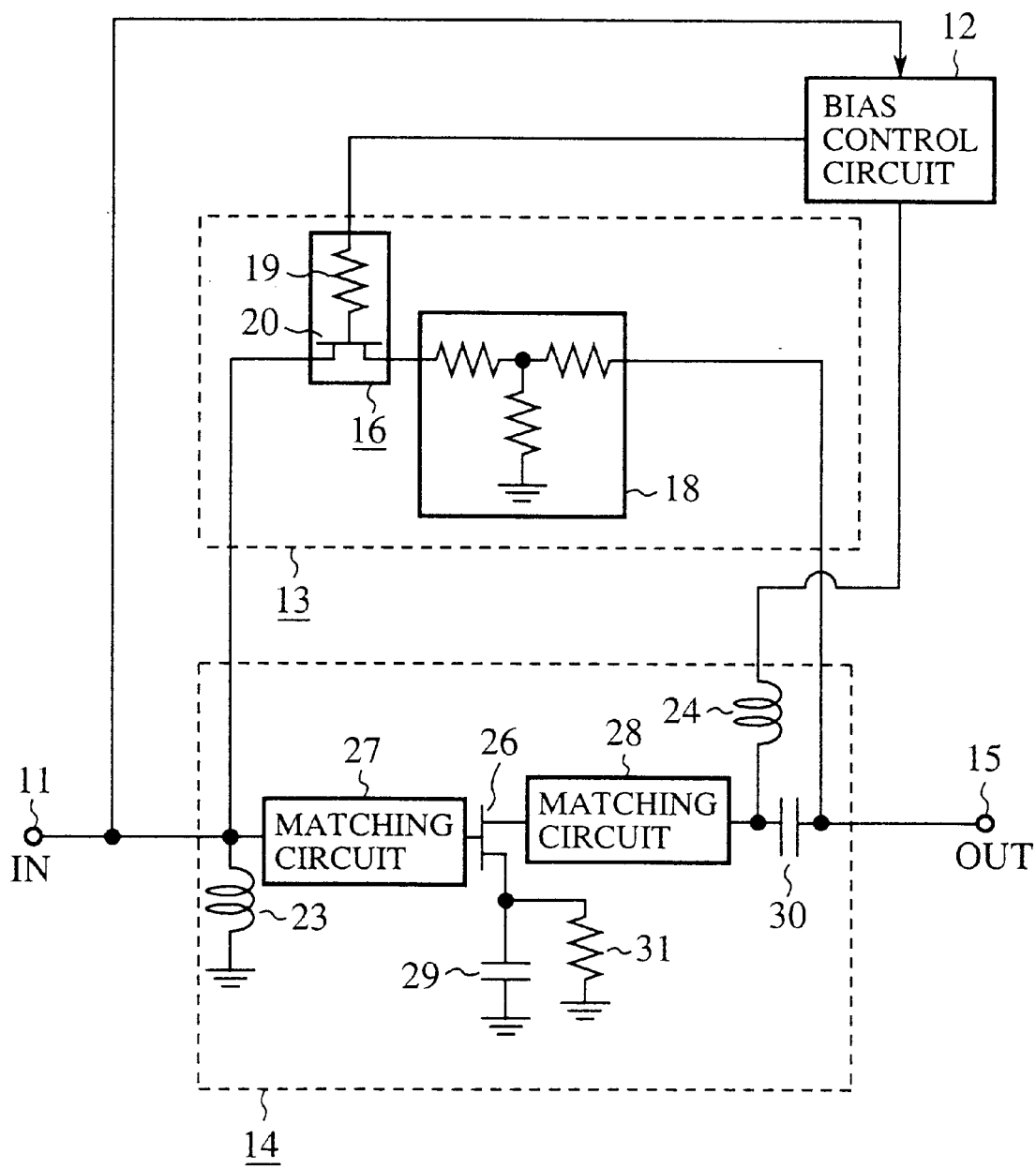
FIG. 12 shows a semiconductor circuit according to a ninth embodiment of the present invention.

In embodiment 3 above and the like, a switch 16 was connected to the input side of the T-type damper 18 and a switch 17 is connected to the output side of the T-type damper 18. As shown in FIG. 12 however the switch 17 may be eliminated.

That is to say, in embodiment 3 above and the like, a switch 17 which is connected in parallel to the output circuit is adapted to be open so that loss is not generated in the output circuit when the amplifier 14 is operated.

However loss in the output circuit does not constitute a problem with respect to reception characteristics when there is sufficient gain in the amplifier 14.

Embodiment 9 is adapted to eliminate the switch 17. However when the switch 17 is eliminated, although some loss is generated from the point of view of the output side of the amplifier 14 as the T-type damper 18 appears to be connected in parallel, this entails the advantage that the dimensions of the circuit may be reduced since the number of switches is reduced.

The T-type damper 18 which is connected in parallel to the output circuit of the amplifier 14 operates as a stable circuit on the output side. In addition, it is possible to utilize a part of the circuit as a matching circuit. In embodiment 3 above, it is possible to further reduce the dimensions of the circuit as it is possible to eliminate the bias feed inductor 25 which is connected to the output terminal of the amplifier 14.

Embodiment 10

Figure 13:
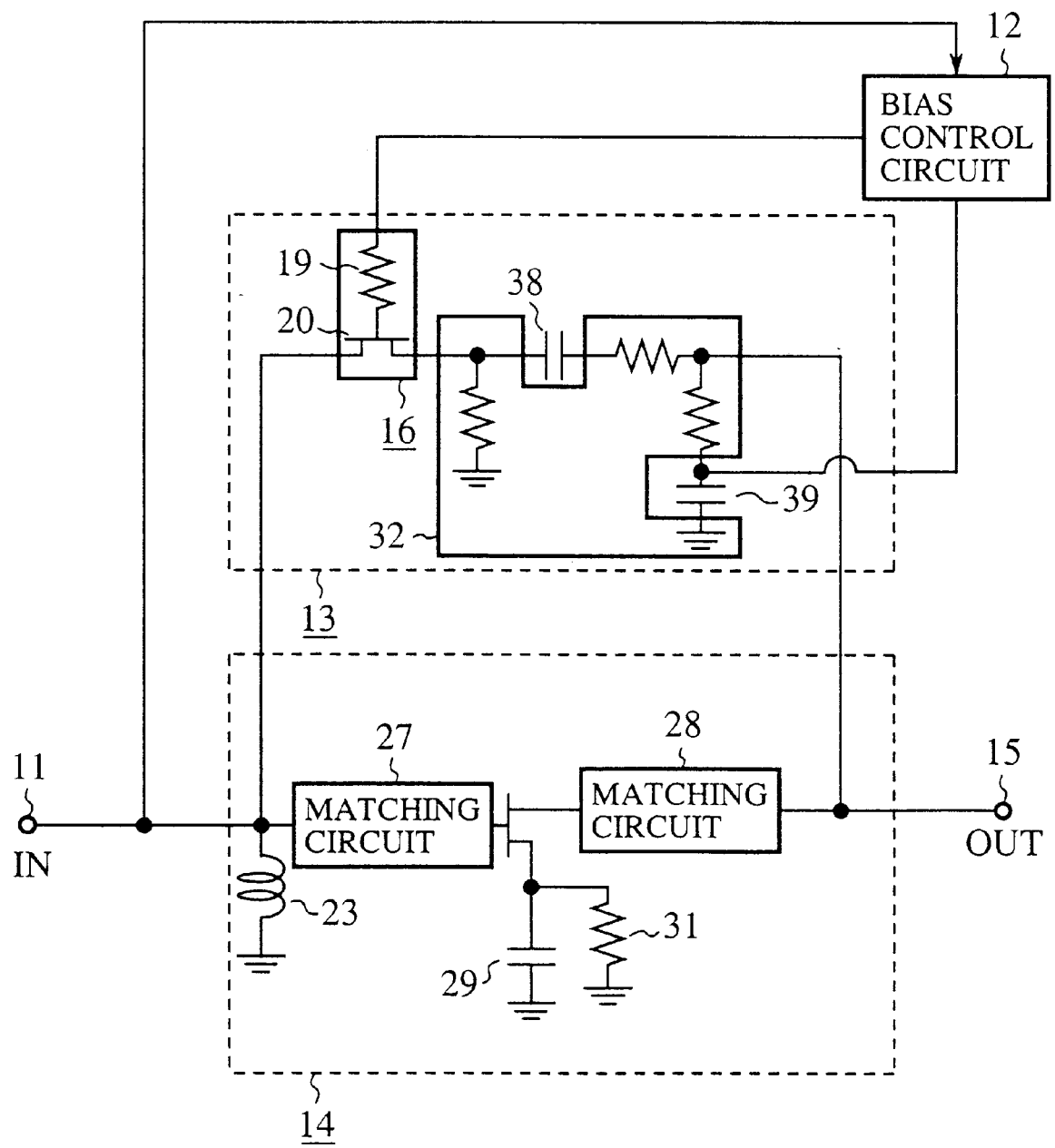
FIG. 13 shows a semiconductor circuit according to a tenth embodiment of the present invention.

In embodiment 9, a variable damper 13 was constituted using a T-type damper 18. However as shown in FIG. 13, it is possible to connect a π-type damper 32 instead of the T-type damper 18, to connect a DC cutting condenser 38, 39 and to supply electricity through the π-type damper 32 to the drain terminal of the amplifier FET 26.

In other words, positioning the T-type damper 18 in the π-type damper 32 has no effect on the operation. However due to the variation in these circuits, the connecting terminal of the parallel resistor of the π-type damper 32 with the DC cutting condenser 39 is earthed at high frequencies and is directly connected to the drain terminal of the amplifier FET 26.

Thus according to embodiment 10, since power can be supplied to the drain terminal of the amplifier FET 26 from the connection terminal, it is possible to eliminate the bias feed inductor 25 and reduce the size of the circuit.

Although a π-type damper 32 was used as a damper in this embodiment, a T-type damper will achieve the same effect.

It is possible to achieve the same effect with a π-type damper or T-type damper or a bridged T-type damper.

Furthermore the same effect is obtained by connecting the π-type damper 32 or the like to the gate drain of the amplifier FET 26 and not to the input/output of the amplifier 14.

INDUSTRIAL APPLICATION

As shown above, a semiconductor circuit of the present invention is used effectively in a system in which the signal level of a received high frequency signal undergoes large variation as in the case of mobile communications.

The present invention is particularly effective in avoiding the problem of non-linearity of the amplifier in a system in which linearity of high frequency signals is important.

What is claimed is:

1. A semiconductor circuit provided with
   an amplifier which amplifies an input signal on receipt of an operation permission command,
   a damper which is connected in parallel with said amplifier and which damps an input signal on receipt of an operation permission command, and
   a control which transmits an operation permission command to one of said amplifier or said damper depending on the signal level of an input signal.

2. A semiconductor circuit according to claim 1 wherein
   said amplifier comprises an amplifier which amplifies an input signal and a switch which is connected in parallel with said amplifier, which is in a short circuit state when receiving an operation permission command and which is in an open state when not receiving an operation permission command.

3. A semiconductor circuit according to claim 1 wherein
   said damper comprises an damper which damps an input signal and a switch which is connected in parallel with said damper, which is in a short circuit state when receiving an operation permission command and which is in an open state when not receiving an operation permission command.

4. A semiconductor circuit according to claim 3 wherein
   a switching semiconductor terminal is connected to the input and output sides of said damper.

5. A semiconductor circuit according to claim 4 wherein
   said amplifier is comprised by a transistor, and
   said control makes said switching semiconductor circuit make a transition to an open state when said transistor is in a short circuit state and makes said switching semiconductor circuit make a transition to a short circuit state when said transistor is in an open state.

6. A semiconductor circuit according to claim 4 wherein
   a matching circuit is connected between said damper and an input side of said switching semiconductor circuit and a matching circuit is connected between said damper and an output side of said switching semiconductor circuit.

7. A semiconductor circuit according to claim 1 wherein
   said damper is comprised of a variable damper which regulates a level of attenuation.

8. A semiconductor circuit according to claim 1 wherein
   said damper is comprised using said switching semiconductor terminal and a series circuit of a circuit terminal.

9. A semiconductor circuit according to claim 8 wherein
   said control controls said switching semiconductor terminal while an operational state of said amplifier is maintained.

10. A semiconductor circuit according to claim 3 wherein
    said damper is comprised using a T-type damper with said switching semiconductor terminal connected to an input side.

11. A semiconductor circuit according to claim 3 wherein
    said damper uses a π-type damper with said switching semiconductor terminal connected to an input side.

12. A semiconductor circuit according to claim 10 wherein
    a condenser is connected between the earth and earthing terminal of said T-type damper and a direct current voltage is applied to an output terminal of said transistor comprising said amplifier from said earthing terminal.

* * * * *